United States Patent
Wang et al.

(10) Patent No.: US 11,831,138 B2
(45) Date of Patent: Nov. 28, 2023

(54) FAULT-ARC IDENTIFICATION METHOD, DEVICE AND APPARATUS, AND STORAGE MEDIUM

(71) Applicant: QINGDAO TOPSCOMM COMMUNICATION CO., LTD, Shandong (CN)

(72) Inventors: Huarong Wang, Shandong (CN); Jianhua Wang, Shandong (CN); Yue Ma, Shandong (CN)

(73) Assignee: QINGDAO TOPSCOMM COMMUNICATION CO., LTD, Shandong (CN)

( * ) Notice: Subject to any disclaimer, the term of this patent is extended or adjusted under 35 U.S.C. 154(b) by 18 days.

(21) Appl. No.: 17/769,770

(22) PCT Filed: Dec. 24, 2020

(86) PCT No.: PCT/CN2020/138919
§ 371 (c)(1),
(2) Date: Apr. 18, 2022

(87) PCT Pub. No.: WO2021/136053
PCT Pub. Date: Jul. 8, 2021

(65) Prior Publication Data
US 2022/0390501 A1 Dec. 8, 2022

(30) Foreign Application Priority Data
Jan. 2, 2020 (CN) .......................... 202010000565.5

(51) Int. Cl.
*G06N 3/02* (2006.01)
*G06N 3/08* (2023.01)
(Continued)

(52) U.S. Cl.
CPC ............. *H02H 1/0015* (2013.01); *G06N 3/02* (2013.01); *G06N 3/08* (2013.01); *G01R 31/1272* (2013.01)

(58) Field of Classification Search
CPC .......... G06N 3/02; G06N 3/08; H02H 1/0015; G01R 31/1272
See application file for complete search history.

(56) References Cited

U.S. PATENT DOCUMENTS

| | | | |
|---|---|---|---|
| 2003/0058596 A1* | 3/2003 | MacBeth | G01R 15/183 361/42 |
| 2009/0310755 A1 | 12/2009 | Dinesh et al. | |
| 2016/0370420 A1 | 12/2016 | Langley et al. | |

FOREIGN PATENT DOCUMENTS

| | | |
|---|---|---|
| CN | 101696986 A | 4/2010 |
| CN | 101706527 A | 5/2010 |

(Continued)

OTHER PUBLICATIONS

Liu, Yu-Wei, Chi-Jui Wu, and Yi-Chieh Wang. "Detection of serial arc fault on low-voltage indoor power lines by using radial basis function neural network." International Journal of Electrical Power & Energy Systems 83 (2016): 149-157. (Year: 2016).*

(Continued)

*Primary Examiner* — Hal Schnee
(74) *Attorney, Agent, or Firm* — Yue (Robert) Xu; Apex Attorneys at Law, LLP (57) ABSTRACT

A fault-arc identification method, device and apparatus, and a storage medium. The method comprises: performing sampling on a target arc at a high frequency, and obtaining a high-frequency sampling signal (S11); preprocessing the high-frequency sampling signal, and obtaining a processed sampling signal (S12); performing feature extraction on the processed sampling signal, and obtaining a target arc feature (S13); and inputting the target arc feature to a neural (Continued)

network model, obtaining a target output result, and determining, according to the target output result, whether the target arc is a fault-arc (S14). Performing sampling on a target arc at a high frequency can obtain more arc features from the target arc. Moreover, since a neural network model has favorable data classification capability, using a neural network model to perform determination with respect to the target arc can improve the accuracy and reliability of a fault-arc detection result.

6 Claims, 9 Drawing Sheets

(51) Int. Cl.
  *H02H 1/00* (2006.01)
  *G01R 31/12* (2020.01)

(56) References Cited

FOREIGN PATENT DOCUMENTS

| | | | |
|---|---|---|---|
| CN | 103543375 A | 1/2014 |
| CN | 103823179 A | 5/2014 |
| CN | 204028283 U | 12/2014 |
| CN | 105223476 A | 1/2016 |
| CN | 105425118 A | 3/2016 |
| CN | 105718958 A | 6/2016 |
| CN | 108535589 A | 9/2018 |
| CN | 110320452 A | 10/2019 |
| CN | 110376489 A | 10/2019 |
| CN | 112269110 A | 1/2021 |
| GB | 2375244 A | 11/2002 |

OTHER PUBLICATIONS

Guo, Mou-Fa, Nien-Che Yang, and Wei-Fan Chen. "Deep-learning-based fault classification using Hilbert-Huang transform and convolutional neural network in power distribution systems." IEEE Sensors Journal 19.16 (2019): 6905-6913. (Year: 2019).*
Yang, Kai, et al. "A novel methodology for series arc fault detection by temporal domain visualization and convolutional neural network." Sensors 20.1 (2019): 162. (Year: 2019).*
International Search Report for PCT/CN2020/138919 dated Mar. 23, 2021, ISA/CN.
The 1st Office Action dated Apr. 21, 2022 for the Chinese Patent Application No. CN202011552452.2.English Translation of the 1st Office Action.
The European Search Report dated Dec. 8, 2022 for EP20909461.4.
Haonan Yin, Feature Analysis and Pattern Recognition of Low-voltage Arc Fault, Chinese Selected Doctoral Dissertations and Master's Theses Full-Text Databases (Master) (CDMD), Engineering Technology II, Jul. 31, 2018.
Xiaoxiang Jia, Experimental Research and Feature Extraction of Aviation AC Arc Fault, Wanfang Dissertation,Apr. 14, 2020.
S. Arunachalam et al., A Parametric Model Approach to Arc Fault Detection for DC and AC Power Systems,Conference Record of the 2006 IEEE Industry Applications Conference Forty-First IAS Annual Meeting, pp. 2249-2255, Nov. 11, 2006.

\* cited by examiner

FAULT-ARC IDENTIFICATION METHOD, DEVICE AND APPARATUS, AND STORAGE MEDIUM

The present application is the national phase of International Patent Application No. PCT/CN2020/138919, titled "FAULT-ARC IDENTIFICATION METHOD, DEVICE AND APPARATUS, AND STORAGE MEDIUM", filed on Dec. 24, 2020, which claims priority to Chinese Patent Application No. 202010000565.5, titled "FAULT-ARC IDENTIFICATION METHOD BASED ON HIGH FREQUENCY CURRENT FEATURE", filed on Jan. 2, 2020 with the Chinese Patent Office, both of which are incorporated herein by reference in their entireties.

FIELD

The present disclosure relates to the technical field of electric power, and in particular to a method for identifying a fault arc, an apparatus for identifying a fault arc, a device for identifying a fault arc, and a medium.

BACKGROUND

Arc faults are one of important causes of electrical fires. At present, when detecting a fault arc, an arc is usually sampled and detected at a low-frequency sampling frequency. However, with this detection method, high frequency features of the arc cannot be effectively obtained and obtained features are easily confused with frequency features of household appliances, resulting in misidentification and missed identification of a fault arc. At present, there is no effective solution to this technical problem.

Therefore, how to further improve accuracy and reliability of a fault arc detection result is a technical problem urgently to be solved by those skilled in the art.

SUMMARY

In view of the above, a method for identifying a fault arc, an apparatus for identifying a fault arc, a device for identifying a fault arc, and a medium are provided according to the present disclosure to improve accuracy and reliability of a fault arc detection result. The solutions are described as follows.

A method for identifying a fault arc, includes: sampling a target arc at a high frequency to obtain a high-frequency sampling signal; pre-processing the high-frequency sampling signal to obtain a processed sampling signal; performing feature extraction on the processed sampling signal to obtain a target arc feature; and sending the target arc feature to a neural network model to obtain a target output result, and determining whether the target arc is the fault arc based on the target output result. The neural network model is established by: acquiring an arc feature of a normal arc and an arc feature of the fault arc in advance to obtain training data; and establishing, based on a neural network algorithm, the neural network model by using the training data.

Preferably, the sampling a target arc at a high frequency to obtain a high-frequency sampling signal includes: sampling the target arc at a sampling rate of 1 GHz to obtain the high-frequency sampling signal.

Preferably, the pre-processing the high-frequency sampling signal to obtain a processed sampling signal includes: filtering the high-frequency sampling signal to obtain a filtered sampling signal; and performing adaptive gain adjustment on the filtered sampling signal and filtering out a low-frequency signal in the filtered sampling signal to obtain the processed sampling signal.

Preferably, the performing feature extraction on the processed sampling signal to obtain a target arc feature includes: eliminating a nonlocal extremum point in the processed sampling signal to obtain target sampling points; selecting ten sampling points from the target sampling points chronologically to obtain a target sampling sequence, where the target sampling sequence includes sampling points D, E, F, H, I, J, M, P and S; and performing feature extraction on the target sampling sequence to obtain an amplitude sum dispersion, an amplitude ratio dispersion, a start and end point amplitude sum dispersion, a start and end point amplitude ratio dispersion, a time ratio dispersion, a waveform number, a slope dispersion, a slope differential dispersion, and a point sum dispersion.

The amplitude sum dispersion is calculated by using a following equation:

$$A_1 = |V_{DF}| + |V_{FH}| + |V_{HJ}| + |V_{JP}|$$

the amplitude ratio dispersion is calculated by using a following equation:

$$A_2 = \frac{|V_{FH} - V_{DF}| + |V_{HJ} - V_{FH}| + |V_{JP} - V_{HJ}|}{|V_{DF}| + |V_{FH}| + |V_{HJ}| + |V_{JP}|}$$

where i and j in $V_{ij}$ represent serial numbers of the sampling points in the target sampling sequence, $V_{DF}=\max(y_D,y_E,y_F)-\min(y_D,y_E,y_F)$, $V_{FH}=\max(y_F,y_G,y_H)-\min(y_F,y_G,y_H)$, $V_{HJ}=\max(y_H,y_I,y_J)-\min(y_H,y_I,y_J)$, $V_{JP}=\max(y_J,y_M,y_P)-\min(y_J,y_M,y_P)$, and $y_D$, $y_E$, $y_F$, $y_G$, $y_H$, $y_I$, $y_J$, $y_M$, and $y_P$ respectively represent ordinates of the sampling points D, E, F, H, I, J, M, and P in a world coordinate system;

the start and end point amplitude sum dispersion is calculated by using a following equation:

$$A_3 = |VS_{DF}| + |VS_{FH}| + |VS_{HJ}| + |VS_{JP}|$$

the start and end point amplitude ratio dispersion is calculated by using a following equation:

$$A_4 = \frac{|VS_{FH} - VS_{DF}| + |VS_{HJ} - VS_{FH}| + |VS_{JP} - VS_{HJ}|}{|V_{DF}| + |V_{FH}| + |V_{HJ}| + |V_{JP}|}$$

where i and j in $VS_{ij}$ represent serial numbers of the sampling points in the target sampling sequence, $VS_{DF}=|y_D-y_F|$, $VS_{FH}=|y_F-y_H|$, $VS_{HJ}=|y_H-y_J|$, $VS_{JP}=|y_J-y_P|$, $V_{DF}=\max(y_D,y_E,y_F)-\min(y_D,y_E,y_F)$, $V_{FH}=\max(y_E,y_G,y_H)-\min(y_E,y_G,y_H)$, $V_{HJ}=\max(y_H,y_I,y_J)-\min(y_H,y_I,y_J)$, $V_{JP}=\max(y_J,y_M,y_P)-\min(y_J,y_M,y_P)$, and $y_D$, $y_E,y_F$, $y_G$, $y_H$, $y_I$, $y_J$, $y_M$, and $y_P$ respectively represent the ordinates of the sampling points D, E, F, H, I, J, M, and P in the world coordinate system;

the time ratio dispersion is calculated by using a following equation:

$$A_5 = \frac{|T_2 - T_1| + |T_3 - T_2| + |T_4 - T_3|}{|T_1| + |T_2| + |T_3| + |T_4|}$$

where $T_1$ represents a time interval between sampling points D and F, $T_2$ represents a time interval between sampling points F and H, $T_3$ represents a time interval between sampling points J and H, and $T_4$ represents a time interval between sampling points P and J;

the waveform number is calculated by using a following equation:

$$A_6 = \left\lfloor \frac{\text{length }(y) - 1}{\lfloor 2 \rfloor} \right\rfloor$$

where $\lfloor \cdot \rfloor$ represents a round-down operation, and length (y) represents a length of the target sampling sequence;

the slope dispersion is calculated by using a following equation:

$$A_7 = |X_{EF} - X_{DE}| + |X_{FG} - X_{EF}| + |X_{GH} - X_{FG}| + |X_{HI} - X_{GH}| + |X_{IJ} - X_{HI}| + |X_{JM} - X_{IJ}| + |X_{MP} - X_{JM}|$$

the slope differential dispersion is calculated by using a following equation:

$$A_8 = |X_{FH} - X_{DF}| + |X_{HJ} - X_{FH}| + |X_{JP} - X_{HJ}|; \text{ and}$$

the point sum dispersion is calculated by using a following equation:

$$A_9 = |y_D| + |y_E| + |y_F| + |y_G| + |y_H| + |y_I| + |y_J| + |y_M| + |y_P|,$$

where $X_{FH} = |X_{GH} - X_{FG}|$, $X_{DF} = |X_{EF} - X_{DE}|$, $X_{HJ} = |X_{IJ} - X_{HI}|$, $X_{JP} = |X_{MP} - X_{JM}|$, $X_{EF} = |y_E - y_F|$, $X_{DE} = |y_D - y_E|$, $X_{FG} = |y_F - y_G|$, $X_{GH} = |y_G - y_H|$, $X_{HI} = |y_H - y_I|$, $X_{IJ} = |y_I - y_J|$, $X_{JM} = |y_J - y_M|$, $X_{MP} = |y_M - y_P|$, and $y_D$, $y_E$, $y_F$, $y_G$, $y_H$, $y_I$, $y_J$, $y_M$, and $y_P$ respectively represent the ordinates of the sampling points D, E, F, H, I, J, M, and P in the world coordinate system.

Preferably, the establishing, based on a neural network algorithm, the neural network model by using the training data includes: establishing, based on a convolutional neural network algorithm, the neural network model by using the training data.

Preferably, the sending the target arc feature to a neural network model to obtain a target output result includes: converting the target arc feature to a normalized feature matrix, and sending the normalized feature matrix to the neural network model to obtain the target output result.

An apparatus for identifying a fault arc is further provided according to the present disclosure. The device includes a signal sampling module, a signal processing module, a feature extraction module, and a result determination module. The signal sampling module is configured to sample a target arc at a high frequency to obtain a high-frequency sampling signal. The signal processing module is configured to pre-process the high-frequency sampling signal to obtain a processed sampling signal. The feature extraction module is configured to perform feature extraction on the processed sampling signal to obtain a target arc feature. The result determination module is configured to send the target arc feature to a neural network model to obtain a target output result, and determine whether the target arc is the fault arc based on the target output result. The neural network model is established by: acquiring an arc feature of a normal arc and an arc feature of the fault arc in advance to obtain training data; and establishing, based on a neural network algorithm, the neural network model by using the training data.

A device for identifying a fault arc is further provided according to the present disclosure. The device includes a memory and a processor. The memory stores a computer program. The processor is configured to perform, when executing the computer program, the method for identifying a fault arc.

A computer readable storage medium is further provided according to the present disclosure. The computer readable storage medium stores a computer program. The computer program, when executed by a processor, causes the processor to perform the method for identifying a fault arc.

It can be seen that according to the present disclosure, the arc feature of the normal arc and the arc feature of the fault arc are acquired in advance to obtain the training data, and then the neural network model is established by using the training data based on the neural network algorithm. In performing fault identification on a target arc, the target arc is sampled at a high frequency to obtain the high-frequency sampling signal, then the high-frequency sampling signal is pre-processed to obtain a processed sampling signal and feature extraction is performed on the processed sampling signal to obtain a target arc feature, and then the target arc feature is sent to the neural network model to obtain a target output result, and it is determined whether the target arc is the fault arc based on the target output result. Apparently, more arc features of the target arc are obtained by sampling the target arc at a high frequency, and the neural network model has good data classification ability, so that the accuracy and reliability of the fault arc detection result can be further improved by determining the target arc with the neural network model. The apparatus for identifying a fault arc, the device for identifying a fault arc, and the medium according to the present disclosure also have the above beneficial effects.

BRIEF DESCRIPTION OF THE DRAWINGS

In order to more clearly describe the technical solutions in the embodiments of the present disclosure or the technical solutions in the conventional technology, drawings to be used in the description of the embodiments of the present disclosure or the conventional technology are briefly described hereinafter. It is apparent that the drawings described below are merely used for describing the embodiments of the present disclosure, and those skilled in the art may obtain other drawings according to the provided drawings without any creative effort.

DETAILED DESCRIPTION OF THE EMBODIMENTS

The technical solutions in the embodiments of the present disclosure are clearly and completely described below in conjunction with the drawings in the embodiments of the present disclosure. Apparently, the embodiments described below are only some embodiments of the present disclosure, rather than all the embodiments. Any other embodiments obtained by those skilled in the art based on the embodiments of the present disclosure without any creative effort fall within the protection scope of the present disclosure.

Figure 1:
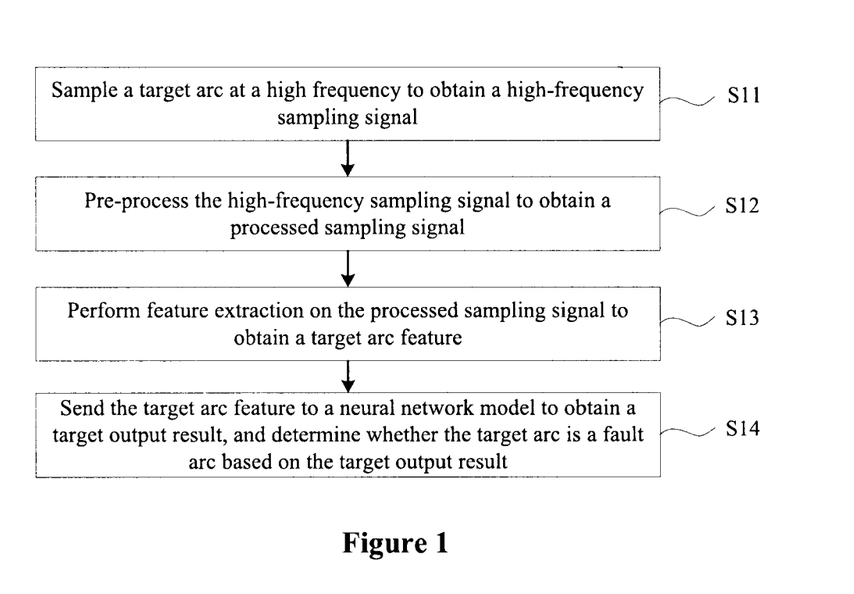
FIG. 1 is a flowchart of a method for identifying a fault arc according to an embodiment of the present disclosure.

Reference is made to FIG. 1, which is a flowchart of a method for identifying a fault arc according to an embodiment of the present disclosure. The method includes the following steps S11 to S14.

In step S11, a target arc is sampled at a high frequency to obtain a high-frequency sampling signal.

In step S12, the high-frequency sampling signal is preprocessed to obtain a processed sampling signal.

In step S13, feature extraction is performed on the processed sampling signal to obtain a target arc feature.

In step S14, the target arc feature is sent to a neural network model to obtain a target output result, and it is determined whether the target arc is the fault arc based on the target output result.

The neural network model is established by: acquiring an arc feature of a normal arc and an arc feature of the fault arc in advance to obtain training data; and establishing, based on a neural network algorithm, the neural network model by using the training data.

In the embodiment, a method for identifying a fault arc is provided. With the method, accuracy and reliability of the fault arc detection result are significantly improved. In the method, an arc feature of a normal arc and an arc feature of the fault arc are acquired in advance to obtain the training data, and then the neural network model is established based on a neural network algorithm by using the training data.

Specifically, in establishing the neural network model, a to-be-trained model is established based on the neural network algorithm. The normal arc and the fault arc are respectively sampled at a high frequency to obtain a high-frequency sampling signal corresponding to the normal arc and a high-frequency sampling signal corresponding to the fault arc. The high-frequency sampling signal corresponding to the normal arc and the high-frequency sampling signal corresponding to the fault arc are respectively preprocessed to obtain a processed sampling signal corresponding to the normal arc and a processed sampling signal corresponding to the fault arc. Feature extraction is respectively performed on the processed sampling signal corresponding to the normal arc and the processed sampling signal corresponding to the fault arc to obtain an arc feature corresponding to the normal arc and an arc feature corresponding to the fault arc, that is, the training data. The to-be-trained model is trained by using the training data to obtain the neural network model. Apparently, the neural network model is a mathematical model for performing fault classification on arcs.

In performing fault identification on the target arc, the target arc is sampled at a high frequency to obtain a high-frequency sampling signal. It is conceivable that in a case of sampling the target arc at a high frequency, more arc features of the target arc may be obtained.

Figure 2:
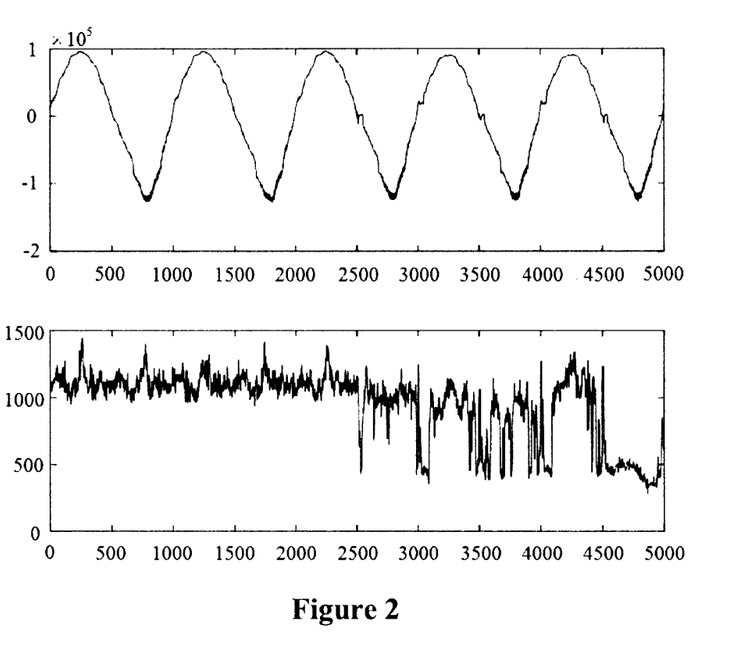
FIG. 2 is a schematic diagram of waveforms when an arc fault occurs with an electric drill.
Figure 3:
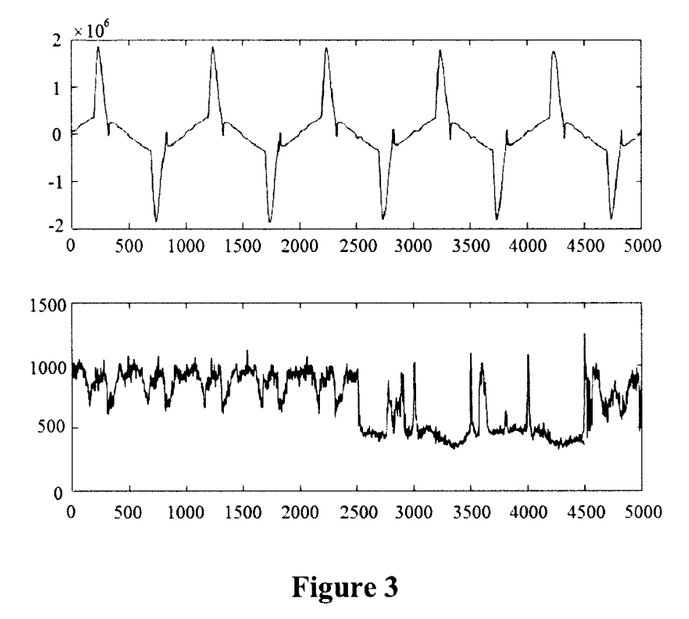
FIG. 3 is a schematic diagram of waveforms when an arc fault occurs with a switch power supply.
Figure 4:
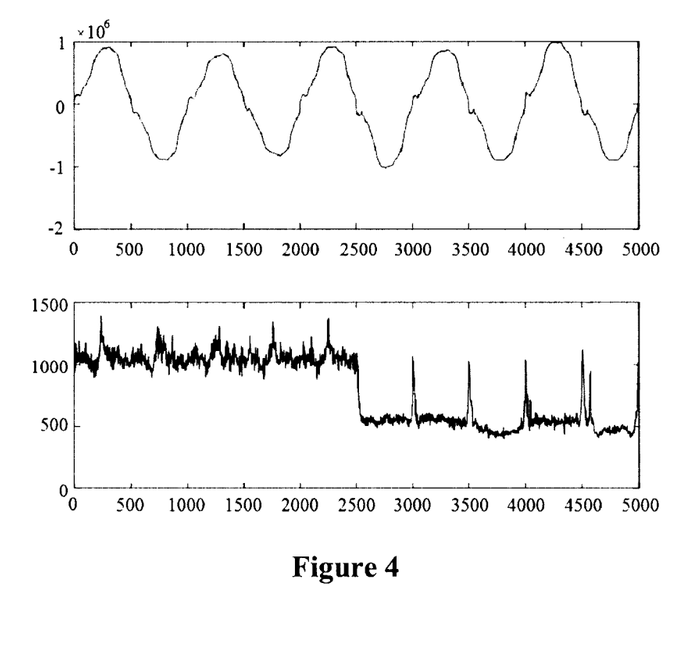
FIG. 4 is a schematic diagram of waveforms when an arc fault occurs with an air compressor.
Figure 5:
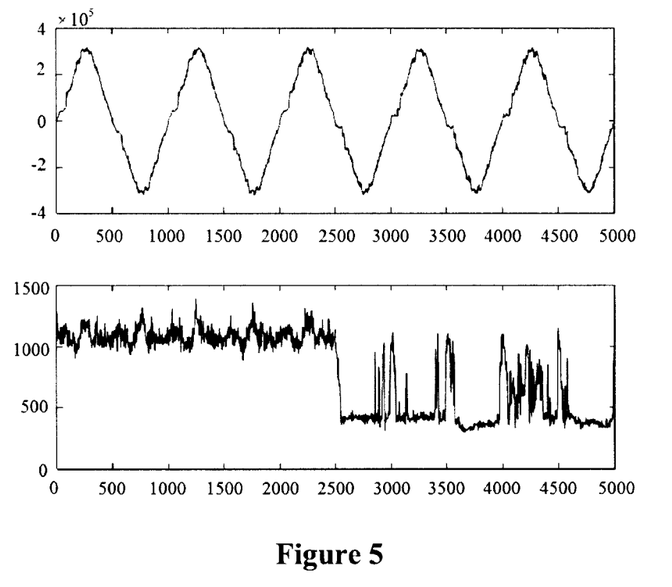
FIG. 5 is a schematic diagram of waveforms when an arc fault occurs with a vacuum cleaner.
Figure 6:
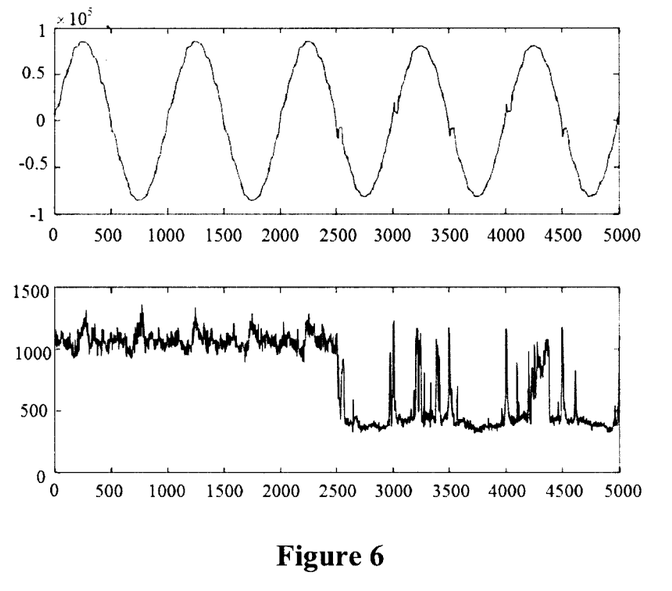
FIG. 6 is a schematic diagram of waveforms when an arc fault occurs with a vacuum cleaner.
Figure 7:
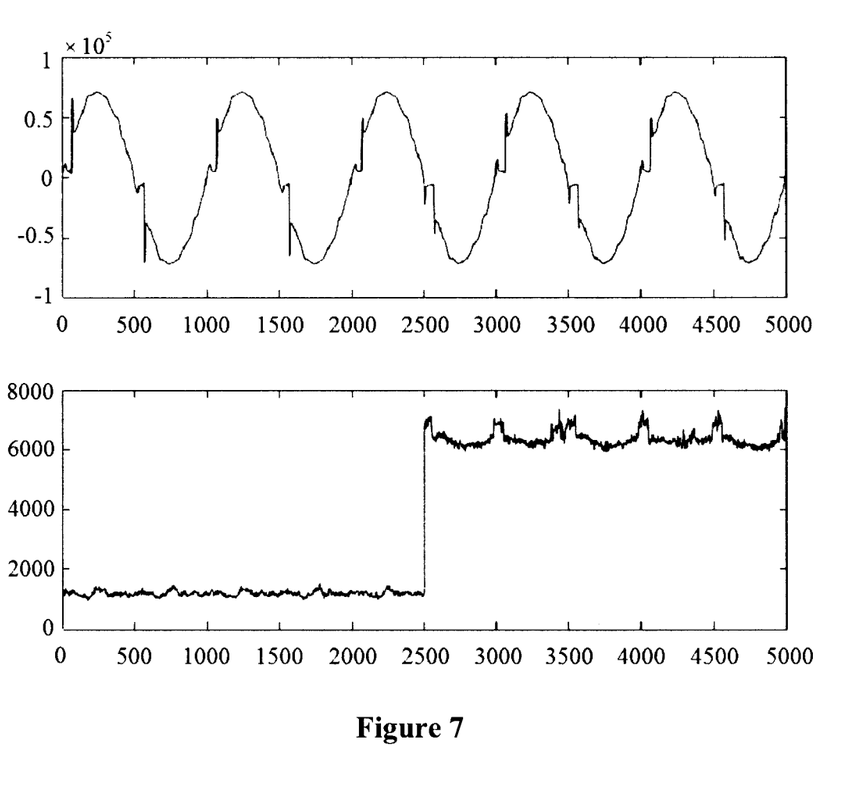
FIG. 7 is a schematic diagram of waveforms when an arc fault occurs with a dimmer.

Reference is made to FIG. 2 to FIG. 7. FIG. 2 is a schematic diagram of waveforms when an arc fault occurs with an electric drill. The upper part of FIG. 2 shows an arc feature collected at a low-frequency sampling frequency when an arc fault occurs with the electric drill. The lower part of FIG. 2 shows an arc feature collected at a high-frequency sampling frequency when an arc fault occurs with the electric drill. FIG. 3 is a schematic diagram of waveforms when an arc fault occurs with a switch power supply. The upper part of FIG. 3 shows an arc feature collected at a low-frequency sampling frequency when an arc fault occurs with the switch power supply. The lower part of FIG. 3 shows an arc feature collected at a high-frequency sampling frequency when an arc fault occurs with the switch power supply. FIG. 4 is a schematic diagram of waveforms when an arc fault occurs with an air compressor. The upper part of FIG. 4 shows an arc feature collected at a low-frequency sampling frequency when an arc fault occurs with the air compressor. The lower part of FIG. 4 illustrates an arc feature collected at a high-frequency sampling frequency when an arc fault occurs with the air compressor. FIG. 5 is a schematic diagram of waveforms when an arc fault occurs with a vacuum cleaner. The upper part of FIG. 5 shows an arc feature collected at a low-frequency sampling frequency when an arc fault occurs with the vacuum cleaner. The lower part of FIG. 5 shows an arc feature collected at a high-frequency sampling frequency when an arc fault occurs with the vacuum cleaner. FIG. 6 is a schematic diagram of waveforms when an arc fault occurs with a vacuum cleaner. The upper part of FIG. 6 shows an arc feature collected at a low-frequency sampling frequency when an arc fault occurs with the vacuum cleaner. The lower part of FIG. 6 shows an arc feature collected at a high-frequency sampling frequency when an arc fault occurs with the vacuum cleaner. FIG. 7 is a schematic diagram of waveforms when an arc fault occurs with a dimmer. The upper part of FIG. 7 shows an arc feature collected at a low-frequency sampling frequency when an arc fault occurs with the dimmer. The lower part of FIG. 7 shows an arc feature collected at a high-frequency sampling frequency when an arc fault occurs with the dimmer. From FIG. 2 to FIG. 7, it can be seen that, compared with collecting at the low-frequency sampling frequency, more obvious and distinguishable arc feature may be obtained from the target arc by collecting at the high-frequency sampling frequency.

The high-frequency sampling signal is preprocessed to obtain a processed sampling signal, so that an impurity signal in the high-frequency sampling signal is removed, facilitating the processing of the subsequent processes. Then, feature extraction is performed on the processed sampling signal to obtain a target arc feature. Finally, the target arc feature is sent to the neural network model, and it is determined whether the target arc is the fault arc based on an output result from the neural network model.

It should be understood that in the conventional technology, a target arc is classified by using a classification method of setting a threshold. However, the conventional technology is difficult to adapt to different load environments. The neural network model has strong data learning ability, and has good data classification ability. Therefore, the target arc is identified and determined by using the neural network model, further improving the accuracy and reliability of identifying the target arc.

It can be seen that according to the embodiments, the arc feature of the normal arc and the arc feature of the fault arc are acquired in advance to obtain the training data, and then the neural network model is established by using the training data based on the neural network algorithm. In performing fault identification on a target arc, the target arc is sampled at a high frequency to obtain the high-frequency sampling signal, then the high-frequency sampling signal is pre-processed to obtain a processed sampling signal and feature extraction is performed on the processed sampling signal to obtain a target arc feature, and then the target arc feature is sent to the neural network model to obtain a target output result, and it is determined whether the target arc is the fault arc based on the target output result. Apparently, more arc features of the target arc are obtained by sampling the target arc at a high frequency, and, the neural network model has good data classification ability, so that the accuracy and reliability of the fault arc detection result can be further improved by determining the target arc with the neural network model.

Based on the above embodiments, the technical solutions are further explained and optimized in an embodiment. As a preferred embodiment, the step in which a target arc is sampled at a high frequency to obtain a high-frequency sampling signal includes: sampling the target arc at a sampling rate of 1 GHz to obtain the high-frequency sampling signal.

In the embodiment, the target arc is sampled at the sampling rate of 1 GHz to obtain the high-frequency sampling signal. The sampling rate of 1 GHz is much higher than the sampling rate at which the target arc is sampled in the conventional technology, facilitating the feature extraction performed on the target arc in subsequent processes.

In addition, in practical applications, the target arc may be sampled at the sampling rate of 1 GHz by using an ASIC (application specific integrated circuit), obtaining sampling components with high frequency in the target arc. Compared with other integrated chips, the ASIC has stronger anti-interference ability and lower system power consumption.

Based on the above embodiments, the technical solutions are further explained and optimized in an embodiment. As a preferred embodiment, the step in which the high-frequency sampling signal is pre-processed to obtain a processed sampling signal includes: filtering the high-frequency sampling signal to obtain a filtered sampling signal; and performing adaptive gain adjustment on the filtered sampling signal and filtering out a low-frequency signal in the filtered sampling signal to obtain the processed sampling signal.

In the embodiment, the high-frequency sampling signal is preprocessed. That is, in preprocessing the high-frequency sampling signal, the high-frequency sampling signal is filtered firstly to remove the impurity signal in the high-frequency sampling signal and obtain the filtered sampling signal, and then adaptive gain adjustment is performed on the filtered sampling signal and the low-frequency signal in the filtered sampling signal is filtered out to obtain the processed sampling signal.

It is apparently that with the technical solutions according to the embodiment, the influence and interference of the impurity signal on the arc fault identification result can be relatively avoided.

Based on the above embodiments, the technical solutions are further explained and optimized in an embodiment. As a preferred embodiment, the step in which feature extraction is performed on the processed sampling signal to obtain a target arc feature includes: eliminating a nonlocal extremum point in the processed sampling signal to obtain target sampling points; selecting ten sampling points from the target sampling points chronologically to obtain a target sampling sequence, where the target sampling sequence includes sampling points D, E, F, H, I, J, M, P and S; and performing feature extraction on the target sampling sequence to obtain an amplitude sum dispersion, amplitude ratio dispersion, an start and end point amplitude sum dispersion, a start and end point amplitude ratio dispersion, a time ratio dispersion, a waveform number, a slope dispersion, a slope differential dispersion, and a point sum dispersion.

The amplitude sum dispersion is calculated by using the following equation:

$$A_1 = |V_{DF}| + |V_{FH}| + |V_{HJ}| + |V_{JP}|$$

The amplitude ratio dispersion is calculated by using the following equation:

$$A_2 = \frac{|V_{FH} - V_{DF}| + |V_{HJ} - V_{FH}| + |V_{JP} - V_{HJ}|}{|V_{DF}| + |V_{FH}| + |V_{HJ}| + |V_{JP}|}$$

where i and j in $V_{ij}$ represent serial numbers of the sampling points in the target sampling sequence, $V_{DF}$=max$(y_D,y_E,y_F)$−min$(y_D,y_E,y_F)$, $V_{FH}$=max$(y_F,y_G,y_H)$−min$(y_F,y_G,y_H)$, $V_{HJ}$=max$(y_H,y_I,y_J)$−min$(y_H,y_I,y_J)$, $V_{JP}$=max$(y_J,y_M,y_P)$−min$(y_J,y_M,y_P)$, and $y_D$, $y_E$, $y_F$, $y_G$, $y_H$, $y_I$, $y_J$, $y_M$, and $y_P$ respectively represent ordinates of the sampling points D, E, F, H, I, J, M, and P in a world coordinate system.

The start and end point amplitude sum dispersion is calculated by using the following equation:

$$A_3 = |VS_{DF}| + |VS_{FH}| + |VS_{HJ}| + |VS_{JP}|$$

The start and end point amplitude ratio dispersion is calculated by using the following equation:

$$A_4 = \frac{|VS_{FH} - VS_{DF}| + |VS_{HJ} - VS_{FH}| + |VS_{JP} - VS_{HJ}|}{|V_{DF}| + |V_{FH}| + |V_{HJ}| + |V_{JP}|}$$

where i and j in $VS_{ij}$ represent serial numbers of the sampling points in the target sampling sequence, $VS_{DF}=|y_D-y_F|$, $VS_{FH}=|y_F-y_H|$, $VS_{HJ}=|y_H-y_J|$, $VS_{JP}=|y_J-y_P|$, $V_{DF}$=max$(y_D,y_E,y_F)$−min$(y_D,y_E,y_F)$, $V_{FH}$=max$(y_F,y_G,y_H)$−min$(y_F,y_G,y_H)$, $V_{HJ}$=max$(y_H,y_I,y_J)$−min$(y_H,y_I,y_J)$, $V_{JP}$=max$(y_J,y_M,y_P)$−min$(y_J,y_M,y_P)$, and $y_D$, $y_E$, $y_F$, $y_G$, $y_H$, $y_I$, $y_J$, $y_M$, and $y_P$ respectively represent the ordinates of the sampling points D, E, F, H, I, J, M, and P in the world coordinate system.

The time ratio dispersion is calculated by using the following equation:

$$A_5 = \frac{|T_2 - T_1| + |T_3 - T_2| + |T_4 - T_3|}{|T_1| + |T_2| + |T_3| + |T_4|}$$

where $T_1$ represents a time interval between sampling points D and F, $T_2$ represents a time interval between sampling points F and H, $T_3$ represents a time interval between sampling points J and H, and $T_4$ represents a time interval between sampling points P and J.

The waveform number is calculated by using the following equation:

$$A_6 = \left\lfloor \frac{\text{length}(y) - 1}{2} \right\rfloor$$

where $\lfloor \cdot \rfloor$ represents a round-down operation, and length (y) represents a length of the target sampling sequence.

The slope dispersion is calculated by using a following equation:

$$A_7 = |X_{EF}-X_{DE}|+|X_{FG}-X_{EF}|+|X_{GH}-X_{FG}|+|X_{HI}-X_{GH}|+ \\ |X_{IJ}-X_{HI}|+|X_{JM}-X_{IJ}|+|X_{MP}-X_{JM}|$$

The slope differential dispersion is calculated by using a following equation:

$$A_8 = |X_{FH}-X_{DF}|+|X_{HJ}-X_{FH}|+|X_{JP}-X_{HJ}|$$

The point sum dispersion is calculated by using a following equation:

$$A_9 = |y_D|+|y_E|+|y_F|+|y_G|+|y_H|+|y_I|+|y_J|+|y_M|+|y_P|$$

where $X_{FH}=|X_{GH}-X_{FG}|$, $X_{GF}=|X_{EF}-X_{DE}|$, $X_{HJ}=|X_{IJ}-X_{HI}|$, $X_{JP}=|X_{MP}-X_{JM}|$, $X_{EF}=|y_E-y_F|$, $X_{DE}=|y_D-y_E|$, $X_{FG}=|y_F-y_G|$, $X_{GH}=|y_G-y_D|$, $X_{HI}=|y_H-y_I|$, $X_{IJ}=|y_I-y_J|$, $X_{JM}=|y_J-y_M|$, $X_{MP}=|y_M-y_P|$, and $y_D$, $y_E$, $y_F$, $y_G$, $y_H$, $y_I$, $y_J$, $y_M$, and $y_P$ respectively represent the ordinates of the sampling points D, E, F, H, I, J, M, and P in the world coordinate system.

Figure 9:
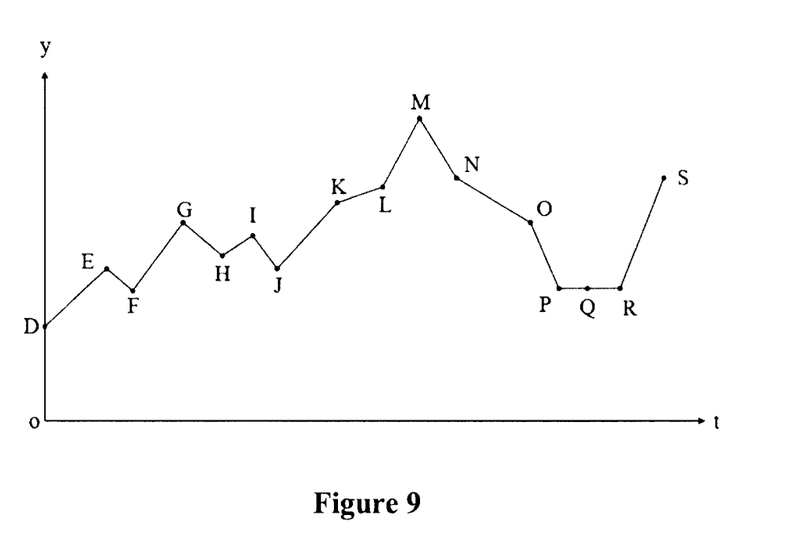
FIG. 9 is a schematic diagram of a waveform in performing feature extraction on a processed sampling signal of a target arc.
Figure 10:
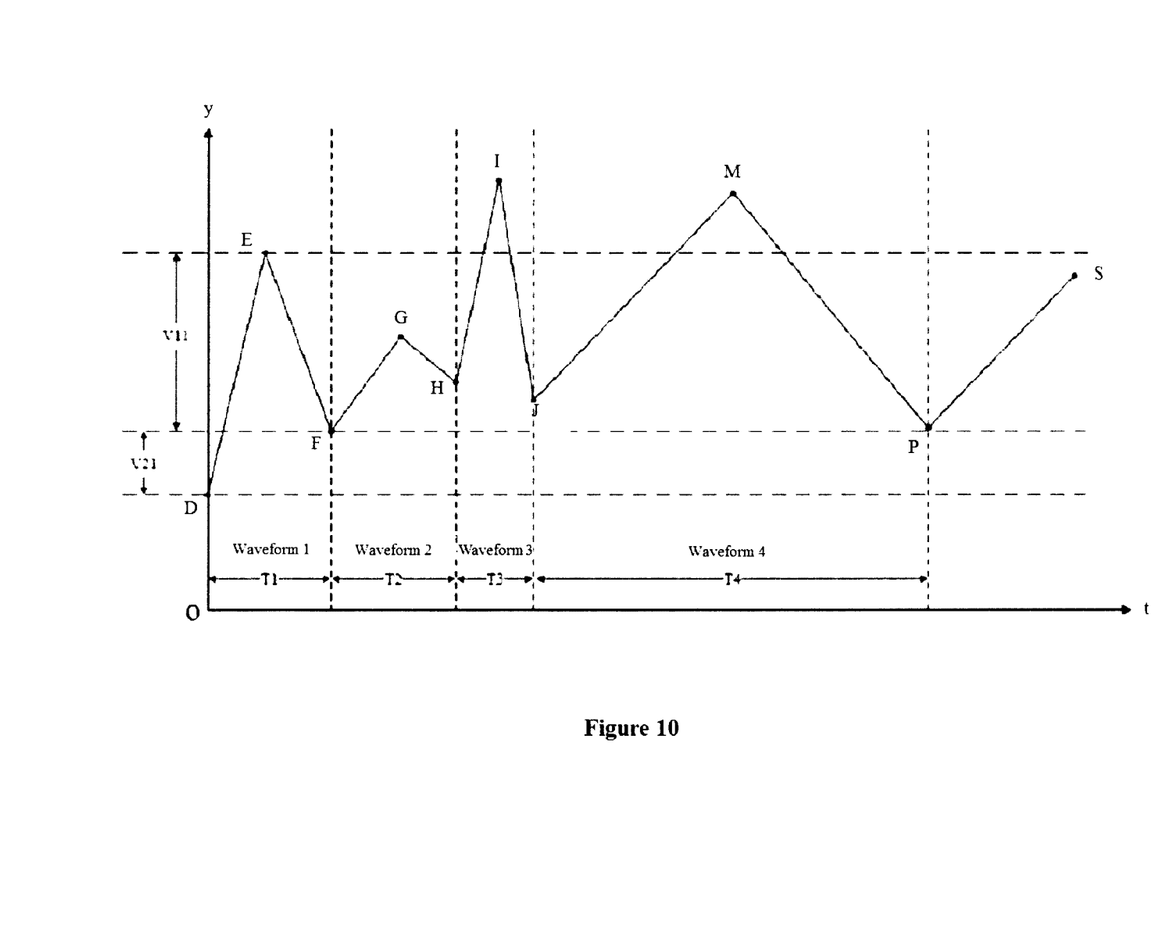
FIG. 10 is a schematic diagram of a schematic diagram of waveform of a processed sampling signal obtained after pre-processing a target arc.

In the embodiment, an implementation of performing feature extraction on the processed sampling signal is provided. Reference is made to FIG. 9 and FIG. 10. FIG. 9 is a schematic diagram of a waveform in performing feature extraction on a processed sampling signal of a target arc. FIG. 10 is a schematic diagram of a waveform of a processed sampling singal obtained after pre-processing a target arc.

After the processed sampling signal of the target arc is obtained, a nonlocal extremum point in the processed sampling signal is eliminated to obtain target sampling points. Then ten sampling points are selected from the target sampling points chronologically to obtain a target sampling sequence. The target sampling sequence includes sampling points D, E, F, H, I, J, M, P and S. Finally, nine arc features of the target sampling sequence are extracted. The nine arc features include an amplitude sum dispersion, an amplitude ratio dispersion, a start and end point amplitude sum dispersion, a start and end point amplitude ratio dispersion, a time ratio dispersion, a waveform number, a slope dispersion, a slope differential dispersion, and a point sum dispersion.

Based on the above embodiments, the technical solutions are further explained and optimized in an embodiment. As a preferred embodiment, the step of establishing, based on a neural network algorithm, the neural network model by using the training data includes: establishing, based on a convolutional neural network algorithm, the neural network model by using the training data.

It should be understood that based on the neural network algorithm, various algorithms, such as a BP (Back Propagation) neural network algorithm, a RBF (Radial Basis Function) neural network algorithm, a perceptron neural network algorithm and a self-organizing neural network algorithm, may be derived.

Specifically, the neural network model is established based on the convolution neural network algorithm and the training data according to the embodiment. Compared with other neural network algorithms, the convolution neural network is more suitable for high-dimensional data, and a best classification effect can be achieved by setting a weight in the algorithm without manually extracting a feature parameter. Therefore, the neural network model is established based on the convolution neural network algorithm and the training data according to the embodiment.

Figure 8:
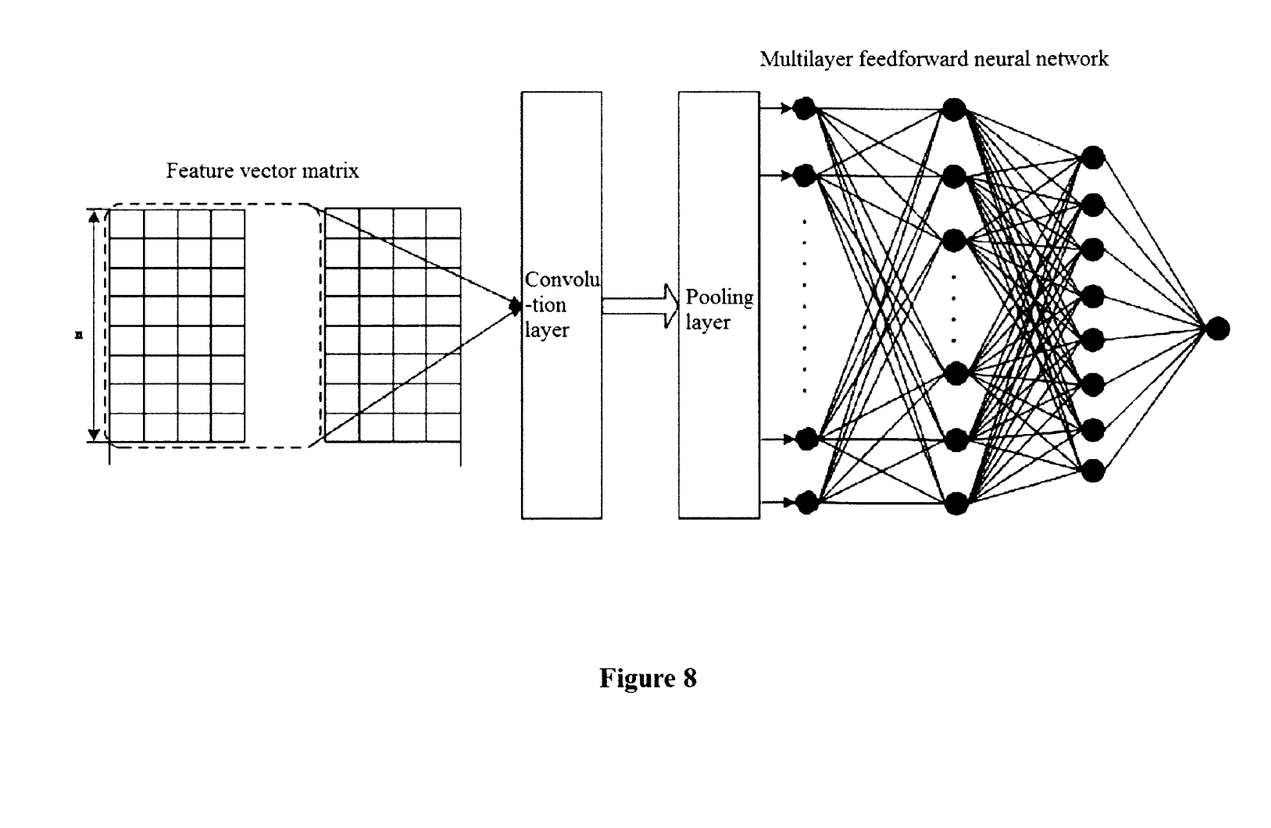
FIG. 8 is a schematic diagram of a neural network model established based on a convolution neural network algorithm.

Reference is made to FIG. 8, which is a schematic diagram of a neural network model established based on a convolution neural network algorithm. The neural network model includes a convolution layer, a pooling layer and a fully connected layer. In the neural network model, the convolution layer performs a convolution operation on the target arc feature by using three 3*3 convolution kernels. Then, the pooling layer performs a dimensionality reduction operation on a convolution result, that is, the pool layer reduces the dimension of the target arc feature to obtain a one-dimensional vector and then provides the one-dimensional vector to the fully connected layer for fault identification of the target arc.

It is apparently that with the technical solutions according to the embodiments, the accuracy of fault identification of the target arc can be further improved.

Based on the above embodiments, the technical solutions are further explained and optimized in an embodiment. As a preferred embodiment, the step in which the target arc feature is sent to a neural network model to obtain a target output result includes: converting the target arc feature to a normalized feature matrix, and sending the normalized feature matrix to the neural network model to obtain the target output result.

In the embodiment, in order to further improve a speed of identifying the target arc by the neural network model, after the target arc feature of the target arc is obtained, the target arc feature is converted to the normalized feature matrix. Based on the normalized feature matrix, a calculation convergence speed of the neural network model can be significantly improved. Therefore, the speed of performing fault identification on the target arc by the neural network model can be further accelerated by sending the normalized feature matrix to the neural network model.

Figure 11:
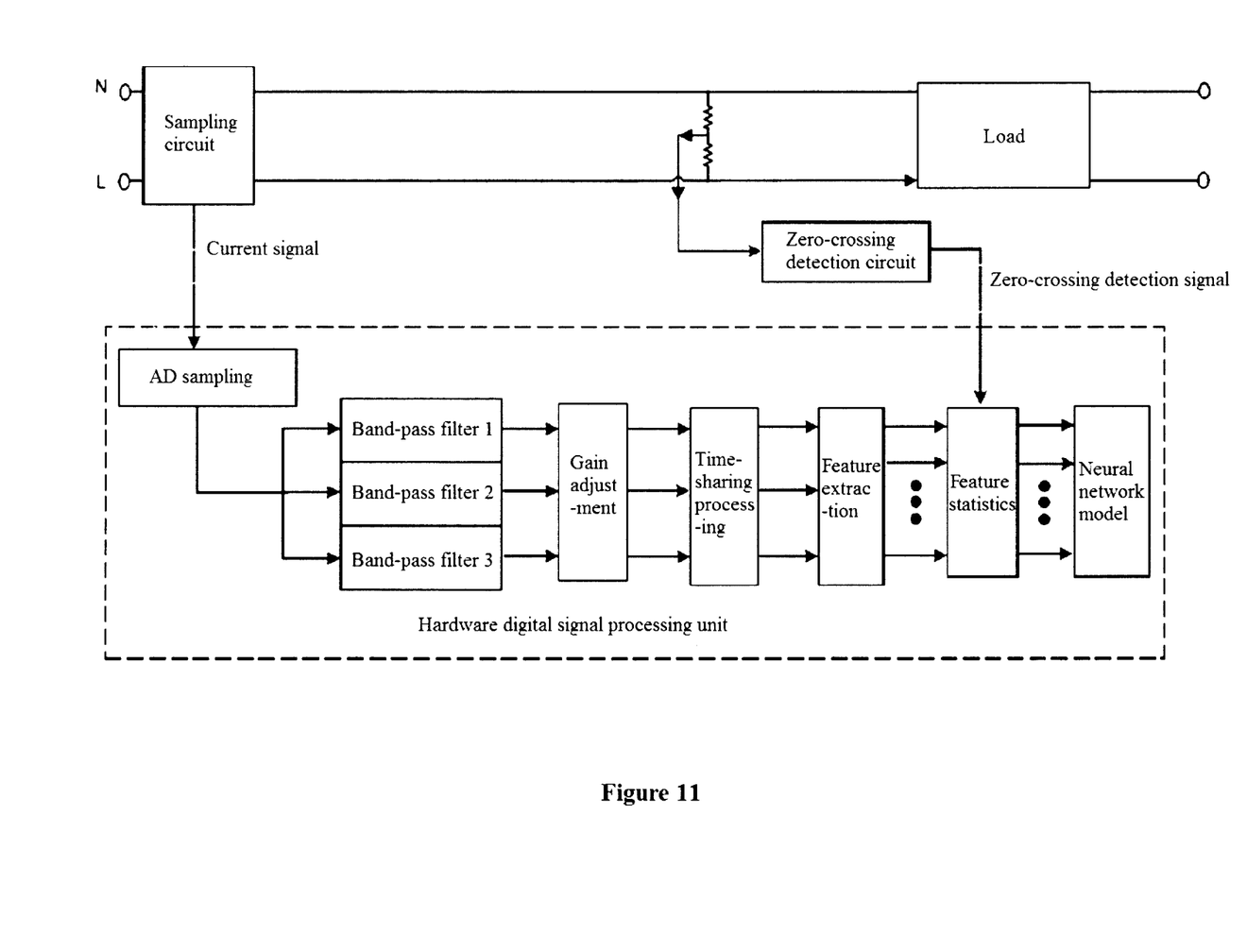
FIG. 11 is a schematic diagram of performing fault identification on an target arc according to an embodiment of the present disclosure.

In order to enable those skilled in the art to clearly understand the principle of the present disclosure, the embodiment is described by taking an example. Reference is made to FIG. 11, which is a schematic diagram of performing fault identification on an target arc according to an embodiment of the present disclosure.

In the actual operations, a target current is sampled by a sampling circuit to obtain a target arc, then the target arc is sampled at a sampling frequency of 1 GHz to obtain a high-speed sampling signal, and then the high-speed sampling signal is filtered by a band-pass filter 1, a band-pass filter 2 and a band-pass filter 3. The band-pass filter 1 has a band-pass frequency band ranging from 500 KHz to 50 MHz, the band-pass filter 2 has a band-pass frequency band ranging from 50 MHz to 100 MHz, and the band-pass filter 3 has a band-pass frequency band ranging from 100 MHz to 200 MHz. By using the band-pass filters having different band-pass frequency bands, high-frequency sampling signals of the target arc in different frequency bands are extracted.

For each of filtered half waves having a time period of 10 ms, the filtered half wave is equally divided into 500 segments to obtain segmented waveforms each of which having a time period of 20 us. Gain adjustment and time-sharing processing are performed on the segmented waveforms to obtain processed sampling signals. Then, for each of the processed sampling signals, an amplitude sum dispersion, an amplitude ratio dispersion, a start and end point amplitude sum dispersion, a start and end point amplitude ratio dispersion, a time ratio dispersion, a waveform number, a slope dispersion, a slope differential dispersion, and a point sum dispersion of the processed sampling signal are extracted. Simultaneously, feature statistics is performed based on a zero-crossing signal triggered by a zero-crossing detection circuit, statistical arc features are sent to the neural network model, and thus fault identification may be performed on the target arc by using the neural network model.

It should be noted that in the embodiment, after obtaining 500 segments of processed sampling signals, a feature vector having 500 dimensions is obtained, and the feature vector in each of the dimensions has 9 arc features. Thus, a normalized feature matrix may be formed based on the 500*9 arc features. The normalized feature matrix is sent to the neural network model, so that it may be determined whether the target arc is a fault arc based on an output result of the neural network model.

Apparently, more arc features of the target arc are obtained by sampling the target arc at a high frequency, and the neural network model has good data classification ability, so that the accuracy and reliability of the fault arc detection result can be further improved by determining the target arc with the neural network model.

Figure 12:
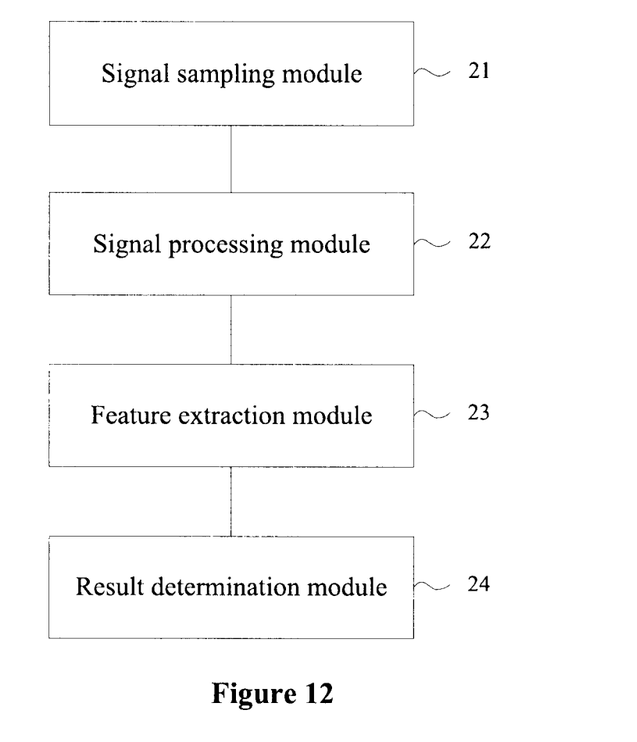
FIG. 12 is a schematic structural diagram of an apparatus for identifying a fault arc according to an embodiment of the present disclosure.

Reference is made to FIG. 12, which is a schematic structural diagram of an apparatus for identifying a fault arc according to an embodiment of the present disclosure. The apparatus includes a signal sampling module 21, a signal processing module 22, a feature extraction module 23, and a result determination module 24.

The signal sampling module 21 is configured to sample a target arc at a high frequency to obtain a high-frequency sampling signal.

The signal processing module 22 is configured to pre-process the high-frequency sampling signal to obtain a processed sampling signal.

The feature extraction module 23 is configured to perform feature extraction on the processed sampling signal to obtain a target arc feature.

The result determination module 24 is configured to send the target arc feature to a neural network model to obtain a target output result, and determine whether the target arc is the fault arc based on the target output result.

The neural network model is established by: acquiring an arc feature of a normal arc and an arc feature of the fault arc in advance to obtain training data; and establishing, based on a neural network algorithm, the neural network model by using the training data.

The apparatus for identifying a fault arc according to the embodiment of the present disclosure has the beneficial effects of the method for identifying a fault arc described above.

Figure 13:
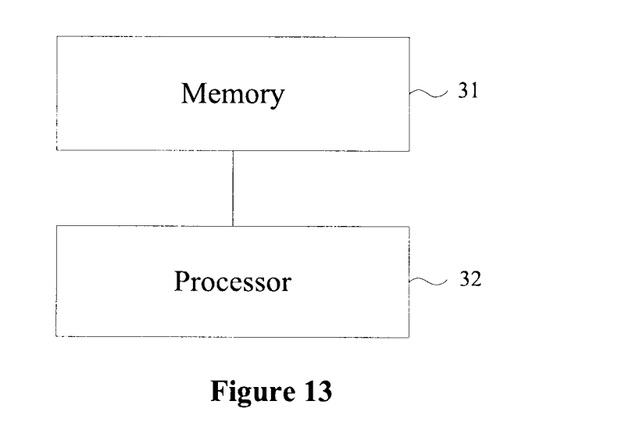
FIG. 13 is a schematic structural diagram of a device for identifying a fault arc according to an embodiment of the present disclosure.

Reference is made to FIG. 13, which is a schematic structural diagram of a device for identifying a fault arc according to an embodiment of the present disclosure. The device includes a memory 31 and a processor 32.

The memory 31 stores a computer program.

The processor 32 is configured to perform, when executing the computer program, the method for identifying a fault arc described above.

The device for identifying a fault arc according to the embodiment of the present disclosure has the beneficial effects of the method for identifying a fault arc described above.

A computer readable storage medium is further provided according to an embodiment of the present disclosure. The computer readable storage medium stores a computer program. The computer program, when executed by a processor, causes the processor to perform the method for identifying a fault arc described above.

The computer readable storage medium according to the embodiment of the present disclosure has the beneficial effects of the method for identifying a fault arc described above.

The embodiments of the present disclosure are described in a progressive manner, each embodiment focuses on differences from other embodiments, and the same or similar parts between the various embodiments may be referred to each other. For the apparatus disclosed in the embodiments, since the device corresponds to the method disclosed in the embodiments, the description of the apparatus is relatively simple, and the relevant parts may be referred to the method part.

Finally, it should be noted that in the present disclosure, relationship terms such as "first" and "second" are merely for distinguishing one entity or operation from another entity or operation rather than indicating or implying an actual relationship or order between these entities or operations. In addition, terms of "include", "comprise" or any other variants thereof are intended to be non-exclusive. Therefore, a process, a method, an article or a device including a series of elements includes not only the elements but also other elements that are not enumerated, or also include elements inherent in the process, the method, the article or the device. Unless expressively limited otherwise, the statement "including one . . . " does not exclude a case that other similar elements may exist in the process, the method, the article or the device.

The method for identifying a fault arc, the apparatus for identifying a fault arc and the device for identifying a fault arc, and the medium according to the present disclosure are described in detail above. Specific examples are used to explain the principle and the embodiments of the present disclosure. The description of the above embodiments is only used for facilitating understanding the method and the core idea of the method according to the present disclosure. In addition, those skilled in the art may make variations to the embodiments and the application scope based on the idea of the present disclosure. Therefore, the content of the specification should not be understood as a limitation of the present disclosure.

The invention claimed is:
1. A method for identifying a fault arc, comprising:
sampling a target arc at a sampling rate of 1 GHz to obtain a high-frequency sampling signal;
pre-processing the high-frequency sampling signal to obtain a processed sampling signal;
performing feature extraction on the processed sampling signal to obtain a target arc feature; and
sending the target arc feature to a neural network model to obtain a target output result, and determining whether the target arc is the fault arc based on the target output result, wherein
the neural network model is established by:
acquiring an arc feature of a normal arc and an arc feature of the fault arc in advance to obtain training data; and
establishing, based on a neural network algorithm, the neural network model by using the training data;
wherein the performing feature extraction on the processed sampling signal to obtain a target arc feature comprises:
eliminating a nonlocal extremum point in the processed sampling signal to obtain target sampling points;
selecting ten sampling points from the target sampling points chronologically to obtain a target sampling sequence, wherein the target sampling sequence comprises sampling points D, E, F, G, H, I, J, M, P and S; and performing feature extraction on the target sampling sequence to obtain an amplitude sum dispersion, an amplitude ratio dispersion, a start and end point amplitude sum dispersion, a start and end point amplitude ratio dispersion, a time ratio dispersion, a waveform number, a slope dispersion, a slope differential dispersion, and a point sum dispersion, wherein the amplitude sum dispersion is calculated by using a following equation:

$$A_1 = |V_{DF}| + |V_{FH}| + |V_{HJ}| + |V_{JP}|$$

the amplitude ratio dispersion is calculated by using a following equation:

$$A_2 = \frac{|V_{FH} - V_{DF}| + |V_{HJ} - V_{FH}| + |V_{JP} - V_{HJ}|}{|V_{DF}| + |V_{FH}| + |V_{HJ}| + |V_{JP}|}$$

where i and j in $V_{ij}$ represent serial numbers of the sampling points in the target sampling sequence, $V_{DF}=\max(y_D,y_E,y_F)-\min(y_D,y_E,y_F)$, $V_{FH}=\max(y_F,y_G,y_H)-\min(y_F,y_G,y_H)$, $V_{HJ}=\max(y_H,y_I,y_J)-\min(y_H,y_I,y_J)$, $V_{JP}=\max(y_J,y_M,y_P)-\min(y_J,y_M,y_P)$, and $y_D$, $y_E$, $y_F$, $y_G$, $y_H$, $y_I$, $y_J$, $y_M$, and $y_P$ respectively represent ordinates of the sampling points D, E, F, G, H, I, J, M, and P in a world coordinate system;

the start and end point amplitude sum dispersion is calculated by using a following equation:

$$A_3 = |VS_{DF}| + |VS_{FH}| + |VS_{HJ}| + |VS_{JP}|$$

the start and end point amplitude ratio dispersion is calculated by using a following equation:

$$A_4 = \frac{|VS_{FH} - VS_{DF}| + |VS_{HJ} - VS_{FH}| + |VS_{JP} - VS_{HJ}|}{|V_{DF}| + |V_{FH}| + |V_{HJ}| + |V_{JP}|}$$

where i and j in $VS_{ij}$ represent serial numbers of the sampling points in the target sampling sequence $VS_{DF}=|y_D-y_F|$, $VS_{FH}=|y_F-y_H|$, $VS_{HJ}=|y_H-y_J|$, $VS_{JP}=|y_J-y_P|$, $V_{DF}=\max(y_D,y_E,y_F)-\min(y_D,y_E,y_F)$, $V_{FH}=\max(y_F,y_G,y_H)-\min(y_F,y_G,y_H)$, $V_{HJ}=\max(y_H,y_I,y_J)-\min(y_H,y_I,y_J)$, $V_{JP}=\max(y_J,Y_M,y_P)-\min(y_J,y_M,y_P)$, and $Y_D$, $y_E$, $y_F$, $y_G$, $y_H$, $y_I$, $y_J$, $y_M$, and $y_P$ respectively represent the ordinates of the sampling points D, E, F, G, H, I, J, M, and P in the world coordinate system;

the time ratio dispersion is calculated by using a following equation:

$$A_5 = \frac{|T_2 - T_1| + |T_3 - T_2| + |T_4 - T_3|}{|T_1| + |T_2| + |T_3| + |T_4|}$$

where $T_1$ represents a time interval between sampling points D and F, $T_2$ represents a time interval between sampling points F and H, $T_3$ represents a time interval between sampling points J and H, and $T_4$ represents a time interval between sampling points P and J;

the waveform number is calculated by using a following equation:

$$A_6 = \left\lfloor \frac{\text{length }(y) - 1}{2} \right\rfloor$$

where $\lfloor \cdot \rfloor$ represents a round-down operation, and length (y) represents a length of the target sampling sequence;

the slope dispersion is calculated by using a following equation:

$$A_7 = |X_{EF}-X_{DF}|+|X_{FG}-X_{EF}|+|X_{GH}-X_{FG}|+|X_{HI}-X_{GH}|+ |X_{IJ}-X_{HI}|+|X_{JM}-X_{IJ}|+|X_{MP}-X_{JM}|$$

the slope differential dispersion is calculated by using a following equation:

$$A_8 = |X_{FH}-X_{DF}|+|X_{HJ}-X_{FH}|+|X_{JP}-X_{HJ}|$$

the point sum dispersion is calculated by using a following equation:

$$A_9 = |y_D|+|y_E|+|y_F|+|y_G|+|y_H|+|y_I|+|y_J|+|y_M|+|y_P|$$

where $X_{FH}=|X_{GH}-X_{FG}|$, $X_{DF}=|X_{EF}-X_{DF}|$, $X_{HJ}=|X_{IJ}-X_{HI}|$, $X_{JP}=|X_{MP}-X_{JM}|$, $X_{EF}=|y_E-y_F|$, $X_{DF}=|y_D-y_E|$, $X_{FG}=|y_F-y_G|$, $X_{GH}=|y_G-y_H|$, $X_{HI}=|y_H-y_I|$, $X_{IJ}=|y_I-y_J|$, $X_{JM}=|y_J-y_M|$, $X_{MP}=|y_M-y_P|$, and $y_D$, $y_E$, $y_F$, $y_G$, $y_H$, $y_I$, $y_J$, $y_M$, and $y_P$ respectively represent the ordinates of the sampling points D, E, F, G, H, I, J, M, and P in the world coordinate system.

2. The method according to claim 1, wherein the preprocessing the high-frequency sampling signal to obtain a processed sampling signal comprises:
   filtering the high-frequency sampling signal to obtain a filtered sampling signal; and
   performing adaptive gain adjustment on the filtered sampling signal and filtering out a low-frequency signal in the filtered sampling signal to obtain the processed sampling signal.

3. The method according to claim 1, wherein the establishing, based on a neural network algorithm, the neural network model by using the training data comprises:
   establishing, based on a convolutional neural network algorithm, the neural network model by using the training data.

4. The method according to claim 1, wherein the sending the target arc feature to a neural network model to obtain a target output result comprises:
   converting the target arc feature to a normalized feature matrix, and sending the normalized feature matrix to the neural network model to obtain the target output result.

5. A device for identifying a fault arc, comprising:
   a memory, storing a computer program; and
   a processor, configured to perform, when executing the computer program, the method for identifying a fault arc according to claim 1.

6. A computer readable storage medium storing a computer program, wherein the computer program, when executed by a processor, causes the processor to perform the method for identifying a fault arc according to claim 1.

* * * * *